(12) United States Patent
Sun et al.

(10) Patent No.: US 10,142,049 B2
(45) Date of Patent: Nov. 27, 2018

(54) NEAR OPTIMAL FORWARD ERROR CORRECTION SYSTEM AND METHOD

(71) Applicant: Dolby Laboratories Licensing Corporation, San Francisco, CA (US)

(72) Inventors: Xuejing Sun, Beijing (CN); Dong Shi, Shanghai (CN)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 48 days.

(21) Appl. No.: 15/287,868

(22) Filed: Oct. 7, 2016

(65) Prior Publication Data

US 2017/0104552 A1 Apr. 13, 2017

Related U.S. Application Data

(60) Provisional application No. 62/247,519, filed on Oct. 28, 2015.

(51) Int. Cl.
*H04L 1/00* (2006.01)
*H03M 13/35* (2006.01)
*H03M 13/03* (2006.01)

(52) U.S. Cl.
CPC ........ *H04L 1/0009* (2013.01); *H03M 13/033* (2013.01); *H03M 13/353* (2013.01);
(Continued)

(58) Field of Classification Search
CPC ... H04L 1/0009; H04L 1/0041; H04L 1/0042; H03M 13/353; H03M 13/033
See application file for complete search history.

(56) References Cited

U.S. PATENT DOCUMENTS 6,023,296 A * 2/2000 Lee ............... H04N 19/172
375/240.05
6,160,846 A * 12/2000 Chiang ........... H04N 19/176
375/240.05

(Continued)

FOREIGN PATENT DOCUMENTS

WO 2010/111101 9/2010

OTHER PUBLICATIONS

Bolot, Jean-Chrysostome, et al "Adaptive FEC-Based Error Control for Internet Telephony" IEEE Infocom, New York, NY, Mar. 1999.

(Continued)

*Primary Examiner* — Joseph D Torres

(57) ABSTRACT

A method of determining a near optimal forward error correction scheme for the transmission of audio data over a lossy packet switched network having preallocated estimated bandwidth, delay and packet losses, between at least a first and second communications devices, the method including the steps of: determining a first coding rate for the audio data; determining a peak redundancy coding rate for redundant versions of the audio data; determining an average redundancy coding rate over a period of time for redundant versions of the audio data; determining an objective function which maximizes a bitrate-perceptual audio quality mapping of the transmitted audio data including a playout function formulation; and optimizing the objective function to produce a forward error correction scheme providing a high bitrate perceptual audio quality.

11 Claims, 5 Drawing Sheets

(52) U.S. Cl.
CPC .......... *H04L 1/0041* (2013.01); *H04L 1/0042* (2013.01); *H04L 1/0058* (2013.01)

(56) References Cited

U.S. PATENT DOCUMENTS

| | | | |
|---|---|---|---|
| 6,243,497 B1 * | 6/2001 | Chiang | H04N 19/587 348/405.1 |
| 6,690,833 B1 * | 2/2004 | Chiang | H04N 19/176 375/E7.134 |
| 6,795,451 B1 * | 9/2004 | Giorgetta | H04J 3/14 370/428 |
| 6,895,050 B2 * | 5/2005 | Lee | H04N 19/176 375/240.03 |
| 7,257,371 B1 | 8/2007 | Bettinger | |
| 7,359,344 B1 | 4/2008 | Cheng | |
| 7,668,712 B2 | 2/2010 | Wang | |
| 7,675,879 B1 | 3/2010 | Gregory | |
| 7,676,735 B2 | 3/2010 | Luby | |
| 8,015,474 B2 | 9/2011 | Izzat | |
| 8,209,582 B1 * | 6/2012 | Varnica | H03M 13/2909 714/755 |
| 8,233,532 B2 | 7/2012 | Wiegand | |
| 8,352,252 B2 | 1/2013 | Fang | |
| 8,421,804 B2 | 4/2013 | Ostermann | |
| 8,502,859 B2 | 8/2013 | Kamath | |
| 2002/0157058 A1 | 10/2002 | Ariel | |
| 2002/0168007 A1 * | 11/2002 | Lee | H04N 19/176 375/240.03 |
| 2006/0291475 A1 | 12/2006 | Cohen | |
| 2009/0103635 A1 | 4/2009 | Pahalawatta | |
| 2009/0276686 A1 | 11/2009 | Liu | |
| 2012/0265523 A1 | 10/2012 | Greer | |
| 2014/0142958 A1 | 5/2014 | Sharma | |

OTHER PUBLICATIONS

Boutremans, C. et al "Adaptive Joint Playout Buffer and FEC Adjustment for Internet Telephony" INFOCOM, vol. 1, Jan. 1, 2003, pp. 652-662.

Marsh, Ian "Quality Aspects of Internet Telephony" Doctoral Dissertation Stockholm, Sweden Apr. 2009, pp. 1-230.

Wu, H. et al "Adjusting Forward Error Correction with Temporal Scaling for TCP-Friendly Streaming MPEG" Worcester Polytechnic Institute, Computer Science Faculty Publications, Apr. 1, 2003, pp. 1-20.

Chang, Yung-Le et al "Joint Playout and FEC Control for Enhancing Perceived Quality of Multi-Stream Voice Communication" 19th European Signal Processing Conference, Barcelona, Spain, Aug. 29-Sep. 2, 2011, pp. 221-224.

* cited by examiner

NEAR OPTIMAL FORWARD ERROR CORRECTION SYSTEM AND METHOD

CROSS REFERENCE TO RELATED APPLICATIONS

This application claims the benefit of U.S. Provisional Application No. 62/247,519, filed Oct. 28, 2015, and International Application No. PCT/CN2015/091612 filed Oct. 10, 2015, which is incorporated herein by reference.

FIELD OF THE INVENTION

The present invention relates to the field of data transmission and the correction of errors that occur during such transmission, and, in particular, discloses a near optimal Forward Error Correction (FEC) system and method, especially suitable for utilisation in audio transmission environments.

REFERENCES

J.-C. Bolot, S. F. Parisis, and D. Towsley, "Adaptive FEC-based error control for Internet Telephony," in Infocom '99, March 1999.

C. Boutremans and J.-Y. Le Boudec, "Adaptive Joint Playout Buffer and FEC Adjustement for Internet Telephony," EPFL-I&C-ICA, http://icwww.epfl.ch/publications/, Tech. Rep. IC/2002/35, May 2002.

BACKGROUND

Any discussion of the background art throughout the specification should in no way be considered as an admission that such art is widely known or forms part of common general knowledge in the field.

FEC is a frequently employed sender-based technique to combat packet loss in packet-switched networks. Media-independent FEC, such as Reed-Solomon (RS) codes, produces n packets of data from k packets such that the original k packets can be exactly recovered by receiving any subset of k (or more) packets. On the other hand media-dependent FEC generates a redundant packet or payload that is often of lower bitrate (LBR) than Media independent FEC and consequently the recovered signal has lower quality than the original audio signal. LBR payload can be created using the same codec for the primary encoding when the codec supports the required low bitrate, or a completely different low bitrate codec (often with higher complexity).

It is evident that FEC improves voice quality at the expense of increasing bandwidth consumption and delay with redundant payloads, which can sometimes lead to unnecessary waste of precious network bandwidth, even worse, degraded performance due to network congestion. To address this issue, practical systems are often designed to be adaptive. For example, the system disclosed in the Bolot et al. adjusts FEC redundancy and coding rate dynamically according to the measured packet loss rate, which is estimated somewhere in the network and signalled back to the sender, e.g., through RTCP.

Empirically determining an optimal FEC scheme appropriate for the current network condition, bandwidth constraint, and audio codec can be time consuming. The aforementioned references propose methods to generate optimal FEC schemes based on an analytic model. However, several critical factors are missing from the model, which make the model less effective in practice.

SUMMARY OF THE INVENTION

It is an object of the invention, in its preferred form, to provide an improved form of FEC, especially suitable for the transmission of audio data.

In accordance with an initial aspect of the present invention, there is provided a method of determining a near optimal forward error correction scheme for the transmission of audio data over a lossy packet switched network having preallocated estimated bandwidth, delay and packet losses, between at least a first and second communications devices, the method including the steps of: (a) determining a coding rate for the audio data; (b) determining a peak redundancy coding rate for the audio data; (c) determining an average redundancy coding rate over a period of time for the audio data; (d) determining an objective function which maximizes a bitrate-perceptual audio quality mapping of the transmitted audio data including a playout function formulation allowing zero redundant copies; and (e) optimising the objective function to produce a forward error correction scheme providing a high bitrate perceptual audio quality.

In some embodiments, the objective function utilizes the separate peak redundancy coding rate and the average redundancy coding rate in maximizing the bitrate perceptual audio quality. The objective function can utilize the content and position of data within the audio stream to determine the bitrate allocation of the transmitted audio data. The objective function can be of a non linear form, including a sigmoid utility function.

BRIEF DESCRIPTION OF THE DRAWINGS

Embodiments of the invention will now be described, by way of example only, with reference to the accompanying drawings in which.

DETAILED DESCRIPTION

The preferred embodiments provide an analytic framework for optimal FEC scheme generation. The advantages of the preferred embodiment include: 1) allowing for separate peak and average bandwidth constraints; 2) Allowing for content and position dependent bitrate allocation; 3) A nonlinear utility (objective) functions and nonlinear constraints for bitrate-perceptual audio quality mapping; 4) A playout function formulation to allow zero bitrate redundant copies.

Figure 1:
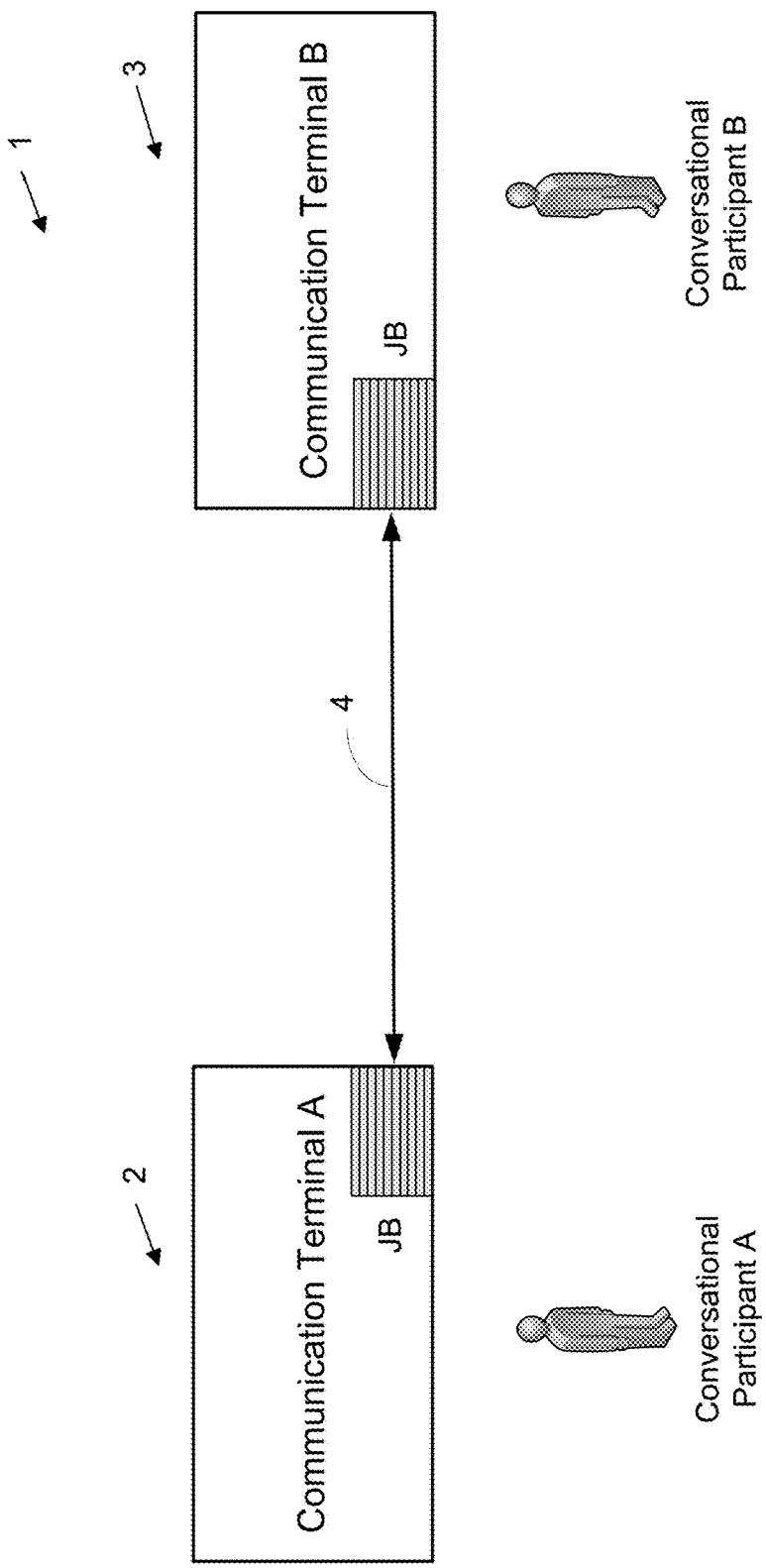
FIG. 1 schematically illustrates an example audio conversation carried out between two participants.
Figure 2:
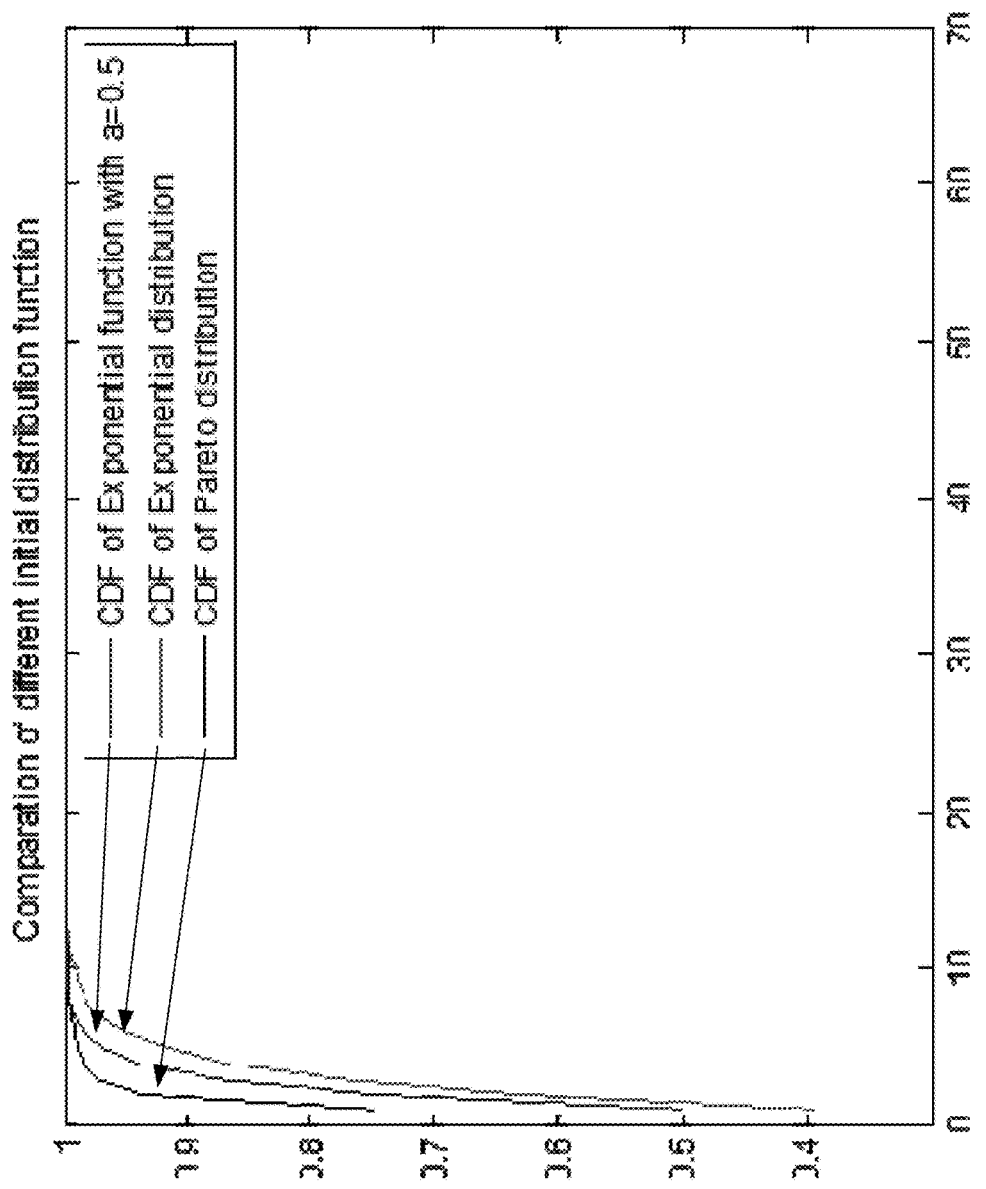
FIG. 2 is a plot of different cumulative distribution functions for packet playout delay.

The embodiments of the invention are adapted to operate on a packet switched network, and are particularly suited for utilisation in audio conferencing operations over packet switched network environments. By way of example, FIG. 1 illustrates one such network environment 1 where an audio conversation is carried out between two participants A and B utilising communications terminal devices 2, 3 which interconnect via a packet switching network 4. As is standard in the art, the audio conversation is digitised, divided into packets and transmitted via the packet switching network 4. The network 4 has a particular bandwidth, delay and packet loss, which may be time varying.

The preferred embodiment proceeds from the perspective of considering, given preallocated constraints on bandwidth, delay and packet loss, what is the near optimal FEC scheme for the transmission of audio data over the network 4.

By way of definition, starting with the following:

Let $R_0$ signify the coding rate for the original audio signal, e.g. A 24 kbps Audio signal data stream;

Let $R_{peak}$ be a peak redundant coding rate in each packet, e.g. $2R_0$;

Let $R_{avg}$ be an average redundant coding rate over a period of time T or number of packets N, e.g. $1.5R_0$.

The choice of FEC schemes can be formulated mathematically as an optimization problem shown below $$\text{Maximize } \Sigma_{n=1}^{N} \Sigma_{i=1}^{K} P_{play}(n,i) f(x_{n,i}) \quad (1)$$

such that $x_{n,i} \geq 0$, where $x_{n,i}$ are the size of the i-th copy of frame n, and $$\Sigma_{i=1}^{K} x_{c(n,i,N),i} \leq R_{peak} \text{ for } 1 \leq n \leq N, \quad (2)$$

where N is the number of consecutive packets to be delivered.

These equations mean that for every packet sent, the total coding rate of the redundant copies in that packet cannot exceed the predefined value $R_{peak}$. c(n, i, N) is a circular shift function for pointing to the right packet index. c(n, i, N)=[n−(i−1)] mod N. For example, if N=5 and n=2, for i=1,2,3,4,5, the output would go 2−(1−1), 2−(2−1), . . . 2−(5−1). The last three output are 0,−1,−2, respectively. However, they can be shifted back to 5,4,3 instead. Therefore, the outputs of are 2,1,5,4,3. Note that 5, rather than 0, is outputted here during the modulo operation.

Also note that $$\frac{1}{N} \sum_{n=1}^{N} \sum_{i=1}^{K} x_{n,i} \leq R_{avg} \quad (3)$$

Given $P_{play}(n, i)$ is the probability of ith copy of packet n is played, and it could be the first received copy or the copy with the best quality, (1), (2) and (3), form an optimization problem where (2) and (3) are constraints and (1) is the objective function. For simplicity, the first strategy is used in this embodiment.

Let $f(x_{n,i})$ be the utility or objective function for the ith copy of packet n. It could include additional arguments such as FEC recovery ratio, mouth-to-ear delay, perceptual importance of packet n, etc:

$$f: \mathbb{R}^+ \times \mathbb{R}^+ \times \mathbb{R}^+ \to \mathbb{R}$$

$x_{n,i}$ represents the coding rate of ith copy of packet n. For example, one typical transform-based codec may support bitrates from 6.4 kbps to 24 kbps at 1.6 kbps steps and 24 kbps to 48 kbps at 8 kbps steps. In another example, the choice is made to restrict ourselves to two coding rates, i.e. the main coding rate (full payload), and the envelope (about 10% of the main coding rate on average for 24 kbps audio encoding). To allow some flexibility, it is assumed coding rate 0 is also valid, which indicates an empty RED. This allows the sending empty packets except for the main copy.

In general the above optimization is a difficult problem to solve and implementing solutions via linear programming can be computationally expensive.

The preferred embodiment includes a simple and computationally inexpensive way to initially find an approximate solution.

$P_{play}(n, i)$ is a function of delay, packet loss rate, and burstiness (I.e. parameters p and q if we use a Gilbert-Elliot (GE) model to describe the channel). For each packet n, it can be shown that $$P_{play}(i) = F_D(D-(i-1)T) \times a_i$$

with $$a_i = \begin{cases} \pi_0 & \text{if } i = 1 \\ \pi_1(1-q)^{i-2}q & \text{if } i > 1 \end{cases}$$

The formulation here is different from that utilised in Bolot as the present formulation allows for an empty copy which simplifies the notation.

$F_D(d)$ is the cumulative distribution function (CDF) of packet playout delay, which may refer to various things depending on the definition and how the jitter is calculated. It could be mouth-to-ear delay, network propagation delay, jitter buffer delay, or a combination of thereof. Jitter may be calculated based on inter-arrival time, or anchor-based packet delay variation, which will affect the CDF and jitter buffer delay estimation. For simplicity, an exponential distribution can be assumed.

Figure 3:
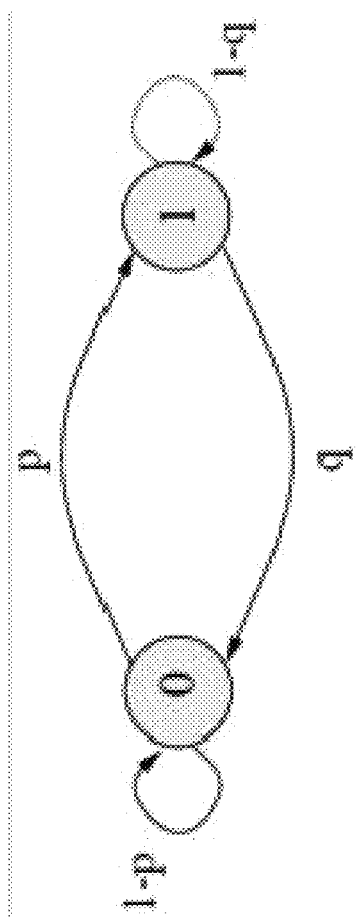
FIG. 3 is a Markov model of transitions for the playout delay.

The GE model, illustrated in FIG. 3, is a two-state model in which state 1 represents a packet loss and state 0 represents a successful packet transmission. The stationary probabilities to be in state 1 ($\pi_1$) and in state 0 ($\pi_0$) are given by:

$$\pi_1 = \frac{p}{p+q} \text{ and } \pi_0 = \frac{q}{p+q}$$

Clearly, $\pi_1$ is the packet loss rate. When p+q=1, the model becomes a Bernoulli model. Parameters p and q can be calculated online easily. For example, let's denote the number of good-bad (or bad-good) transitions by $C_t$, the total number of lost packets by $C_l$, the total number of received packets by $C_r$, then:

$$p = \frac{C_t}{C_r} \text{ and } q = \frac{C_t}{C_l}$$

In practice, 1−q is often used to represent packet loss 'burstiness'. To derive the optimization model, it would be possible to simply enumerate p and q in the range of [0, 1]. The corresponding packet loss rate and burstiness can be derived easily.

Basically, the longer the playout delay, the higher $P_{play}(n, i)$. The probability of first copy (i=1) is governed by the 1-packet loss rate ($\pi_0$). If this is not the first copy, then it depends on packet loss rate as well as transition probability. It is assumed that the first received copy is always played out.

The utility function $f(x_{n,i})$ is difficult to define as the objective model for voice quality is not well defined, and will depend on many factors. For simplicity, let's define $f(x_{n,i})=x_{n,i}$. For example, $x_{n,i} \in \{1,0.5,0\}$, that is full payload is 1, envelope-only payload is 0.5, empty packet is 0.

Figure 4:
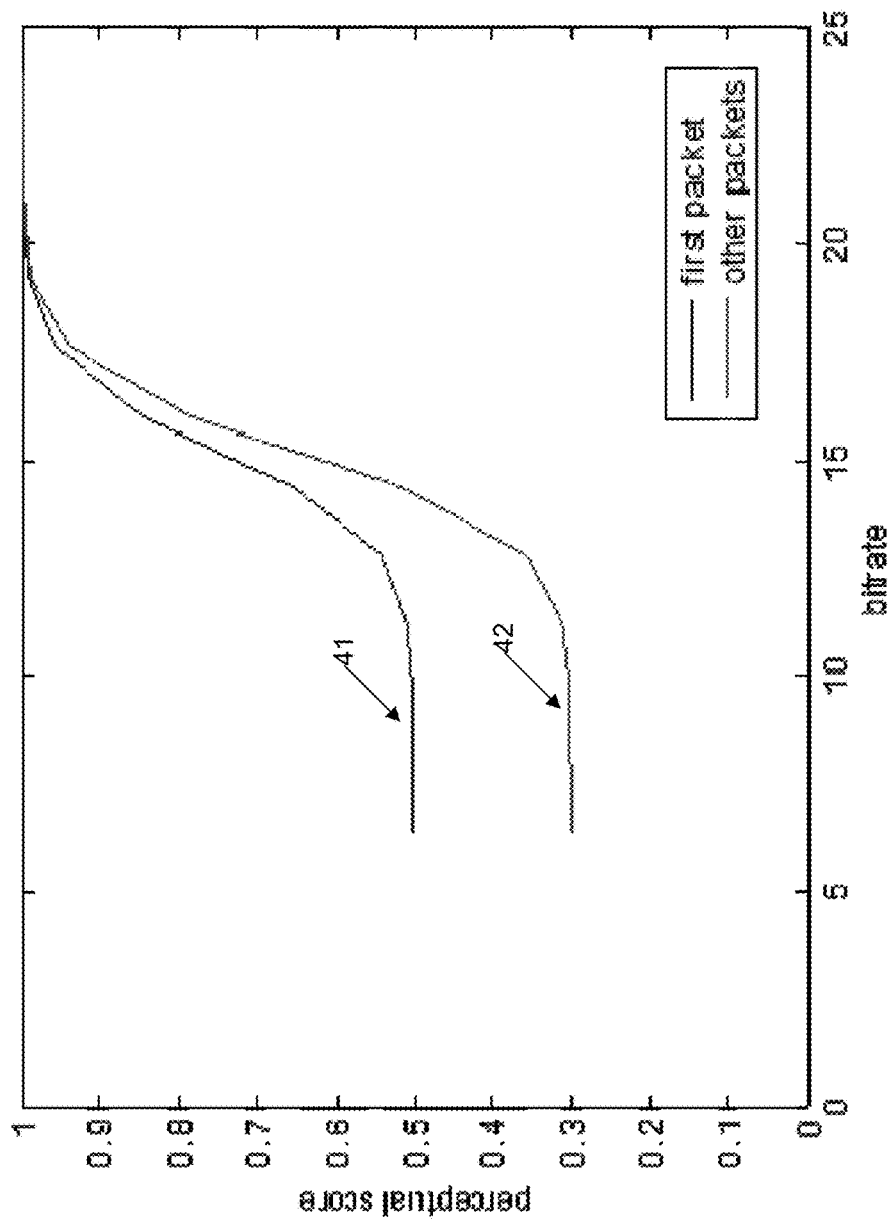
FIG. 4 illustrates different forms of the utility function used in the optimisation process.

Such a linear function does not truthfully reflect the nonlinear relationship between bitrate and perceptual quality. The mapping between these input bitrates and perceptual quality may be better approximated by a sigmoid function. Under the context of FEC, i.e. different packet loss patterns, the mapping might be context dependent, which further complicates the matter. It is further assumed that not all packets are equal perceptually, that is, more degradation is expected when 'important' packets are lost. Then the utility function can be defined as below for example $$f(x_{n,i}) = p_{min} + \frac{1-p_{min}}{1+e^{-(x_{n,i}-\bar{x}_{n,i})}}$$

$$p_{min} = \begin{cases} 0.5 & \text{if } n=1 \\ 0.3 & \text{if } n>1 \end{cases}$$

where $p_{min}$ is the minimum perceptual quality corresponding to a bitrate of 6.4 kbps and $\bar{x}_{n,i}$ is a bias. FIG. 4 illustrates plots of the perceptual score variation with respect to bit rate for a first packet 41 and subsequent packets 42.

In addition to the nonlinear utility function, it is possible to also introduce nonlinearity by using nonlinear constraints. In practice, it would be possible to generate a table of optimal FEC schemes and the real time adaptive FEC selection becomes a table lookup process.

The above optimization problem can be converted into an objective function in a linear form with nonlinear constraints by replacing the utility function with:

$$y_{n,i}=f(x_{n,i})$$

and the above optimization problem can be converted into:

$$Obj=\Sigma_{n=1}^{N}\Sigma_{i=1}^{K}P_{play}(n,i)y_{n,i}$$

Such that: $y_{n,i} \geq 0$, where $y_{n,i}$ are the utility of the i-th copy of frame n; $\Sigma_{i=1}^{K}h(y_{c(n,i,N),i}) \leq R_{peak}$ for $1 \leq n \leq N$, where N is the number of consecutive packets to be delivered; $P_{play}(n,i)$ is the probability of ith copy of packet n is played; $R_{peak}$ is the peak redundant coding rate; c(n, i, N) is a circular shift function; $h(y_{n,i})$ is the inverse of the utility for the ith copy of the packet n with $h(x_{n,i})=f^{-1}(x_{n,i})$; and $f(x_{n,i})$ being a nonlinear utility function in the original formulation.

Specific Examples

1. Using Linear Programming:

The section illustrates some of the optimized coding rate under different conditions:

No. of packets interested: N=3, R_peak=1, R_avg=0.5, Playout probability: p=0.1, q=0.9, D=3, $F_D(d)=1-\exp(-0.5*(D-(i-))$; Utility function: f(n)=exp(-(n-1))*(1-0.5)/(20/24-12.5/24)

Here, the utility function (sigmoid) was approximated with a linear line and assuming the weight of the frames decreases exponentially, i.e., the first frame is the most important. The corresponding objective function is therefore given as:

c=[0.3107,0.1264,0.0393,0.1143,0.0465,0.0145, 0.0421,0.0171,0.0053]

where c contains the weights for the copies, e.g the objective function is actually given by:

$$g=c*[x_{11}\,x_{12}\,x_{13}\,x_{21}\,x_{22}\,x_{23}\,x_{31}\,x_{32}\,x_{33}]^T$$

where $x_{ij}$ represents the j-th copy of i-th frame. The optimized coding rate is given in the matrix below:

$$\begin{bmatrix} x_{11} \\ x_{12} \\ x_{13} \\ x_{21} \\ x_{22} \\ x_{23} \\ x_{31} \\ x_{32} \\ x_{33} \end{bmatrix} = \begin{bmatrix} 1 \\ 0 \\ 0 \\ 0.5 \\ 0 \\ 0 \\ 0 \\ 0 \\ 0 \end{bmatrix}$$

The above result shows that for this scheme, the first frame needs to be replicated with full bit rate and the second frame has a redundant copy with 0.5 coding rate while we cannot generate redundant copies for the rest of the frames (frame 3). The peak rate and average coding rate constraints play crucial roles since for 3 frames with R_avg=0.5, the total coding rate for the whole problem is only 1.5 which is just equal to $x_{11}+x_{21}$.

If the jitter buffer delay D is increased and the number of frame of index N up to 5, with the rest of the conditions unchanged, then the optimized coding rate is equal to:

$$\begin{bmatrix} x_{11} \\ x_{21} \\ x_{31} \end{bmatrix} = \begin{bmatrix} 1 \\ 1 \\ 0.5 \end{bmatrix}$$

which means for every five frames, three redundant copies of the frame 1, 2 and 3 are sent with coding rate equal to 1, 1 and 0.5, respectively. All the other redundant copies are of zero bit rate and therefore are not shown.

If we have a different packet loss probability, i.e., different p,q while the reminder are unchanged, we have No. of packets interested: N=3, R_peak=1, R_avg=0.5, Playout probability: p=0.5, q=0.5, D=3, $F_D(d)=1-\exp(-0.5*(D-(i-))$ Utility function: f(n)=exp(-(n-1))*(1-0.5)/(20/24-12.5/24)

The optimization gives $$\begin{bmatrix} x_{11} \\ x_{12} \\ x_{13} \\ x_{21} \\ x_{22} \\ x_{23} \\ x_{31} \\ x_{32} \\ x_{33} \end{bmatrix} = \begin{bmatrix} 1 \\ 0.5 \\ 0 \\ 0 \\ 0 \\ 0 \\ 0 \\ 0 \\ 0 \end{bmatrix}$$

This means under this condition, it is better to just focus on the first frame. Increasing the frame number N up to 5 gives similar results:

$$\begin{bmatrix} x_{11} \\ x_{12} \\ x_{13} \end{bmatrix} = \begin{bmatrix} 1 \\ 1 \\ 0.5 \end{bmatrix}$$

with all the rest being zero.

Using Nonlinear Programming:

The above problem was reformulated as a nonlinear programming optimisation due to the fact that the utility function is in fact a nonlinear mapping from the bit-rate to the perceptual quality. Therefore, we made only one change to the problem:

Utility function: $f(n)=\exp(-(n-1))*1/(1+\exp(-10*(x-12/24)))$

Figure 5:
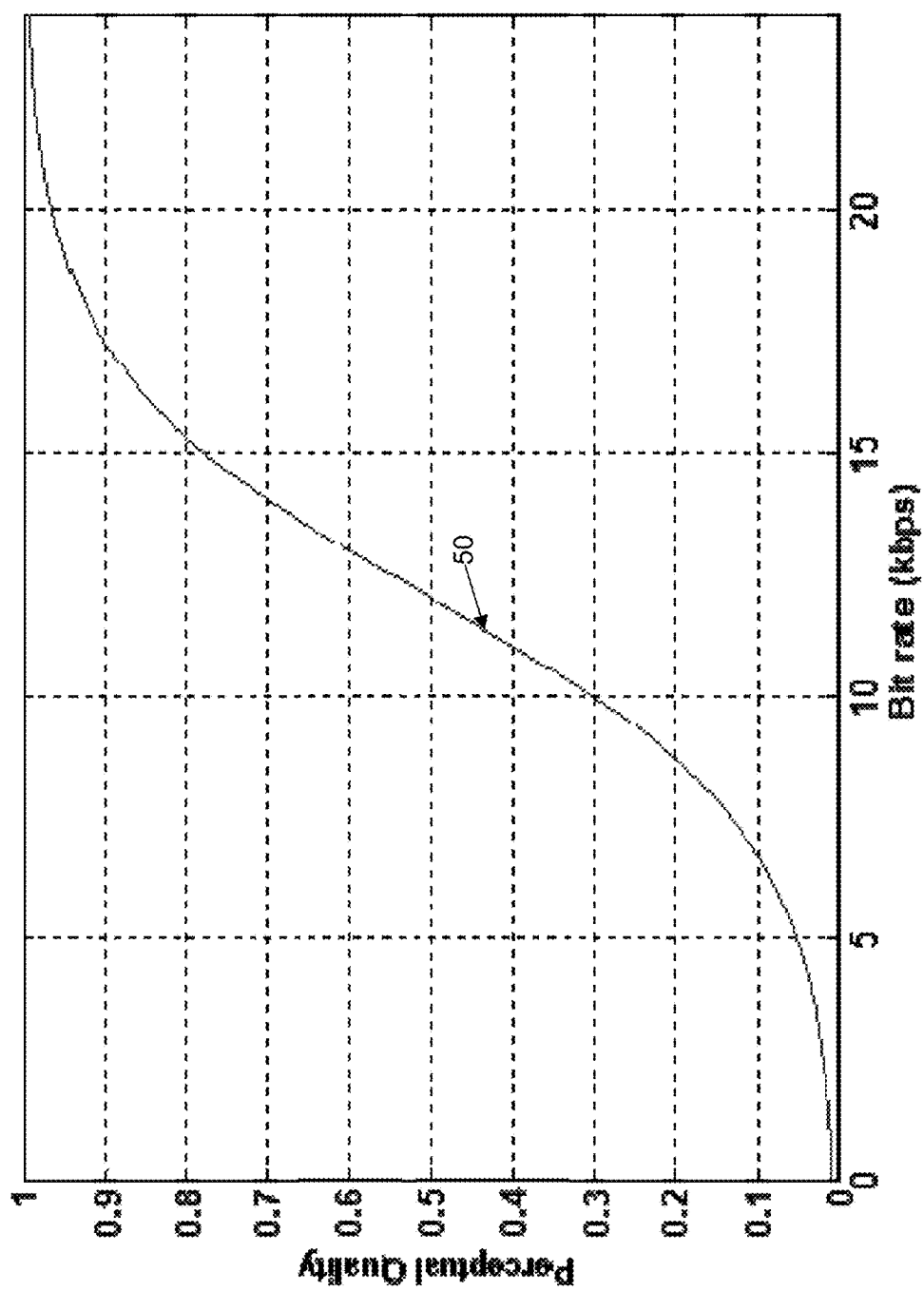
FIG. 5 illustrates a further form of the utility function that is altered to a sigmoid form for a non linear optimisation process.

Compared to the utility function we used in linear programming, the second part of the above function has changed to the sigmoid function that is illustrated in FIG. 5. The function illustrated 50 is used to map the bit rate to the perceptual quality. It is a bit different from the curve above since we need to ensure that when the bit rate approaches to zero, so does the quality.

Therefore, the optimization remains the same as listed in eq. (1) and (2) except that nonlinear programming is used to find the optimal bit rates. Using the same conditions as in the linear programming case:

No. of packets interested: N=3,

R_peak=1, R_avg=0.5,

Playout probability: p=0.1, q=0.9, D=3, $F_D(d)=1-\exp(-0.5*(D-(i-))$

Utility function: $f(n)=\exp(-(n-1))*1/(1+\exp(-10*(x-12/24)))$

The optimal bit rate scheme is designated as:

$$\begin{bmatrix} x_{11} \\ x_{12} \\ x_{13} \\ x_{21} \\ x_{22} \\ x_{23} \\ x_{31} \\ x_{32} \\ x_{33} \end{bmatrix} = \begin{bmatrix} 0.8096 \\ 0 \\ 0 \\ 0.6904 \\ 0 \\ 0 \\ 0 \\ 0 \\ 0 \end{bmatrix}$$

This solution is perhaps more sensible and less trivial compared to the previous one. The sigmoid function can be seen as a "compression" so that the weight for $x_{11}$ is not large enough to take up the full bit rate. The fact that $x_{11}$ is decreased gives more room to $x_{21}$ which is the second most important packets (in terms of weights).

If the number of frames is increased up to 5 as per the linear programming, more sensible results were found (only nonzero packets are listed):

$$\begin{bmatrix} x_{11} \\ x_{21} \\ x_{31} \end{bmatrix} = \begin{bmatrix} 0.9414 \\ 0.8363 \\ 0.7223 \end{bmatrix}$$

Again, the "compression" property of the sigmoid function distributes the bit rates more equally among the packets in comparison to the previous solution using linear programming.

Finally, if the packet loss rate is changed to reflect the previous example, with playout probability: p=0.5, q=0.5, and all other conditions remaining the same, the optimal solution is found as:

$$\begin{bmatrix} x_{11} \\ x_{21} \end{bmatrix} = \begin{bmatrix} 0.8028 \\ 0.6972 \end{bmatrix}$$

Again, finding the solution is not trivial work. Increasing the frame number N up to 5 gives:

$$\begin{bmatrix} x_{11} \\ x_{12} \\ x_{13} \end{bmatrix} = \begin{bmatrix} 0.9150 \\ 0.8372 \\ 0.7478 \end{bmatrix}$$

The above examples show that it is more sensible to optimize the FEC scheme using nonlinear programming. With different packet conditions and utility functions, non-trivial solutions are found. These solutions can be used as references for practical FEC realizations. A simple way is to round the optimal bit rate to whatever available bit rate is required as part of the audio codec. Of course, the result may not be optimal anymore. However, as long as the true bit rate is not too far away from the theoretical results, good performance can be expected. Simulation results under real network conditions confirmed the suitability of the nonlinear approach.

Interpretation

Reference throughout this specification to "one embodiment", "some embodiments" or "an embodiment" means that a particular feature, structure or characteristic described in connection with the embodiment is included in at least one embodiment of the present invention. Thus, appearances of the phrases "in one embodiment", "in some embodiments" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

As used herein, unless otherwise specified the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting only of elements A and B. Any one of the terms including or which includes or that includes as used herein is also an open term that also means including at least the elements/features that follow the term, but not excluding others. Thus, including is synonymous with and means comprising.

As used herein, the term "exemplary" is used in the sense of providing examples, as opposed to indicating quality.

That is, an "exemplary embodiment" is an embodiment provided as an example, as opposed to necessarily being an embodiment of exemplary quality.

It should be appreciated that in the above description of exemplary embodiments of the invention, various features of the invention are sometimes grouped together in a single embodiment, FIG., or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those skilled in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

Similarly, it is to be noticed that the term coupled, when used in the claims, should not be interpreted as being limited to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described what are believed to be the preferred embodiments of the invention, those skilled in the art will recognize that other and further modifications may be made thereto without departing from the spirit of the invention, and it is intended to claim all such changes and modifications as falling within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

The invention claimed is:

1. A method of determining a near optimal forward error correction scheme, the method including the steps of:
   transmitting, by a first communications device, audio data over a lossy packet switched network to a second communications device, the network having preallocated estimated bandwidth, delay, and packet losses, the audio data being divided into encoded packets, where a subset of the packets includes redundant versions of the audio data;
   determining, by the first communications device, a first coding rate for the audio data;
   determining, by the first communications device, a peak redundancy coding rate for the redundant versions of the audio data;
   determining, by the first communications device, an average redundancy coding rate over a period of time for the redundant versions of the audio data;
   determining, by the first communications device, an objective function which maximizes a bitrate-perceptual audio quality mapping of the transmitted audio data including a playout function formulation;
   optimising, by the first communications device, the objective function to identify optimal coding rates for redundant versions of the audio data for subsequent packets of the audio data being sent to the second communications device; and
   transmitting, by the first communications device, packets of the audio data that include the redundant versions of the audio data coded at the optimal coding rate.

2. A method as claimed in claim 1 wherein the objective function further includes a playout function formulation allowing zero redundant copies of the audio data.

3. A method as claimed in claim 1 wherein said objective function utilizes the separate peak redundancy coding rate and the average redundancy coding rate in maximizing the bitrate perceptual audio quality.

4. A method as claimed in claim 1 wherein said objective function utilizes the content and position of data within the audio stream to determine the bitrate allocation of the transmitted audio data.

5. A method as claimed in claim 1 wherein said objective function is of a non linear form.

6. A method as claimed in claim 5 wherein said objective function consists of a non linear utility function.

7. A method as claimed in claim 6 wherein said utility function consists of a sigmoid utility function.

8. A method as claimed in claim 5 wherein said objective function uses nonlinear constraints.

9. A method as claimed in claim 8 wherein said nonlinear constraints consist of an inverse function of sigmoid function.

10. A method as claimed in claim 9 wherein said objective function consists of a linear form of:

$$Obj = \sum_{n=1}^{N} \sum_{i=1}^{K} P_{play}(n,i) y_{n,i}$$

Such that:

$y_{n,i} \geq 0$, where $y_{n,i}$ are the utility of the $i$-th copy of frame $n$, and $\sum_{i=1}^{K} h(y_{c(n,i,N),i}) \leq R_{peak}$ for $1 \leq n \leq N$, where N is the number of consecutive packets to be delivered;

$P_{play}(n,t)$ is the probability of ith copy of packet n is played;

$R_{peak}$ is the peak redundant coding rate;

$c(n,i,N)$ is a circular shift function;

$h(y_{n,i})$ is the inverse of the utility for the ith copy of the packet n.

11. A non-transitory computer-readable storage medium comprising instructions which, when executed by a processor, cause the processor to perform operations comprising:

transmitting audio data over a lossy packet switched network to a second communications device, the network having preallocated estimated bandwidth, delay, and packet losses, the audio data being divided into packets, where a subset of the packets includes redundant versions of the audio data;

determining a first coding rate for the audio data;

determining a peak redundancy coding rate for the redundant versions of the audio data;

determining an average redundancy coding rate over a period of time for redundant versions of the audio data;

determining an objective function which maximizes a bitrate-perceptual audio quality mapping of the transmitted audio data including a playout function formulation;

optimising the objective function to identify optimal coding rates for redundant versions of the audio data for subsequent packets of the audio data; and transmitting packets of the audio data that include the redundant versions of the audio data coded at the optimal coding rate.

* * * * *